United States Patent
Wu et al.

(10) Patent No.: US 9,620,535 B2
(45) Date of Patent: Apr. 11, 2017

(54) TN-TYPE ARRAY SUBSTRATE AND FABRICATION METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Song Wu, Beijing (CN); Jieqiong Bao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/368,614

(22) PCT Filed: Apr. 26, 2013

(86) PCT No.: PCT/CN2013/074799
§ 371 (c)(1),
(2) Date: Jun. 25, 2014

(87) PCT Pub. No.: WO2014/121562
PCT Pub. Date: Aug. 14, 2014

(65) Prior Publication Data
US 2015/0155305 A1  Jun. 4, 2015

(30) Foreign Application Priority Data
Feb. 6, 2013  (CN) .......................... 2013 1 0047920

(51) Int. Cl.
*H01L 27/12* (2006.01)
*H01L 29/45* (2006.01)
(Continued)

(52) U.S. Cl.
CPC .......... *H01L 27/127* (2013.01); *H01L 27/124* (2013.01); *H01L 27/1288* (2013.01);
(Continued)

(58) Field of Classification Search
CPC . H01L 27/127; H01L 27/124; H01L 27/1288; H01L 29/458; H01L 29/45; G02F 2001/136295; G02F 1/1368
See application file for complete search history.

(56) References Cited

U.S. PATENT DOCUMENTS

| | | | |
|---|---|---|---|
| 4,548,688 A | * 10/1985 | Matthews | ............. G03F 7/2024 430/281.1 |
| 2002/0033907 A1 | * 3/2002 | Oke et al. | ....................... 349/46 |

(Continued)

FOREIGN PATENT DOCUMENTS

| | | |
|---|---|---|
| CN | 101650505 A | 2/2010 |
| CN | 102280408 A | 12/2011 |

(Continued)

OTHER PUBLICATIONS

Second Chinese Office Action dated Feb. 15, 2015; Appln. No. 201310047920.4.

(Continued)

*Primary Examiner* — Steven Loke
*Assistant Examiner* — Juanita Rhodes
(74) *Attorney, Agent, or Firm* — Ladas & Parry LLP

(57) ABSTRACT

A TN-type array substrate and a fabrication method thereof, and a display device, the fabrication method of the TN-type array substrate includes: a step of forming a first metal layer, a gate insulating layer, an active layer, a second metal layer and a transparent conductive layer on a substrate, wherein the first metal layer includes a gate electrode, the second metal layer includes a data line, the transparent conductive layer includes a pixel electrode; and wherein the forming the (Continued)

second metal layer and the transparent conductive layer includes: sequentially forming a transparent conductive thin film and a metal thin film on the substrate; performing one-off patterning process on the transparent conductive thin film and the metal thin film to form a thin film transistor (TFT) channel region, the transparent conductive layer and the second metal layer.

13 Claims, 4 Drawing Sheets

(51) Int. Cl.
*G02F 1/1362* (2006.01)
*G02F 1/1368* (2006.01)

(52) U.S. Cl.
CPC ............ *H01L 29/45* (2013.01); *H01L 29/458* (2013.01); *G02F 1/1368* (2013.01); *G02F 2001/136295* (2013.01)

(56) References Cited

U.S. PATENT DOCUMENTS

| | | | | |
|---|---|---|---|---|
| 2008/0136986 | A1* | 6/2008 | Kim | G02F 1/136204 349/40 |
| 2009/0101908 | A1* | 4/2009 | Kwack | G02F 1/136286 257/59 |
| 2009/0295696 | A1* | 12/2009 | Uehara | 345/92 |
| 2010/0012945 | A1* | 1/2010 | Zheng | H01L 21/0272 257/72 |
| 2010/0038644 | A1 | 2/2010 | Song et al. | |
| 2010/0165227 | A1* | 7/2010 | Liu | H01L 27/1214 349/43 |
| 2011/0250713 | A1* | 10/2011 | Kawasaki | H01L 29/458 438/34 |
| 2012/0138972 | A1* | 6/2012 | Li | H01L 29/78633 257/88 |
| 2012/0299901 | A1* | 11/2012 | Chen | G02F 1/13338 345/212 |
| 2013/0029441 | A1* | 1/2013 | Hsu | H01L 27/1288 438/30 |

FOREIGN PATENT DOCUMENTS

| | | | |
|---|---|---|---|
| CN | 102629569 | A | 8/2012 |
| CN | 102629584 | * | 8/2012 |
| CN | 102629584 | A | 8/2012 |

OTHER PUBLICATIONS

International Search Report dated Oct. 24, 2013; PCT/CN2013/074799.
First Chinese Office Action dated Jun. 24, 2014; Appln. No. 201310047920.4.
International Preliminary Report on Patentability Appln. No. PCT/CN2013/074799; Dated Aug. 11, 2015.
Second Chinese Office Action Appln. No. 201310047920.4; Dated Aug. 18, 2015.
Fourth Chinese Office Action dated Feb. 26, 2016; Appln. No. 201310047920.4.

* cited by examiner

TN-TYPE ARRAY SUBSTRATE AND FABRICATION METHOD THEREOF, AND DISPLAY DEVICE

TECHNICAL FIELD

Embodiments of the invention relate to a TN-type array substrate and a fabrication method thereof, and a display device.

BACKGROUND

In the process of fabricating a display panel, exposure by a mask is an important step. Exposure is not only one of the most sophisticated steps in liquid crystal display panel fabrication, but also one of the steps of the highest device investment and operating costs. Therefore, reducing fabrication cost and improving device productivity by reducing the number of times of using the mask and exposing are always a kind of exploration in display panel fabrication.

Conventional Twist Nematic (TN) type display panel includes an array substrate. As illustrated in FIG. 1 and FIG. 2, the array substrate of the TN-type display panel comprises: a transparent substrate 1, and a first metal layer, a gate insulating layer 7, an active layer 8, a second metal layer, a passivation layer 9 and a transparent conductive layer sequentially disposed on the transparent substrate 1. The first metal layer includes a gate line 2 and a gate electrode 31, the second metal layer includes a data line 4, a source electrode 32 and a drain electrode 33; and the transparent conductive layer includes a pixel electrode 5. As illustrated in FIG. 1, the gate line 2 and the data line 4 are arranged intersecting with each other, and a thin film transistor 3 and the pixel electrode 5 are formed in the region enclosed by the gate line 2 and the data line 4. The array substrate further comprises a gate line terminal region and a data line terminal region which are disposed at the edge of the array substrate and are used for connecting circuit boards, as illustrated in FIG. 3, the gate line 2 in the gate line terminal region bb' is connected to the circuit board through a via-hole disposed in the gate insulating layer 7 and the passivation layer 9 thereon, the data line 4 in the data line terminal regions cc' is connected to the circuit board through a via-hole disposed in the passivation layer 9 thereon, and a voltage input of the gate line and the data line is controlled by the circuit board.

In the fabrication process of the array substrate in the prior art, each of the first metal layer, the passivation layer and the pixel electrode layer is formed via one exposure by using a normal mask; the active layer and the second metal layer are formed via one exposure by using a half-tone or a half-gray mask. That is, four times of exposure are needed, which requires more frequent exposure, longer fabrication cycle and higher costs.

SUMMARY

An embodiment of the invention provides a fabrication method of a TN-type array substrate, comprising: a step of forming a first metal layer, a gate insulating layer, an active layer, a second metal layer and a transparent conductive layer on a substrate, wherein the first metal layer includes a gate electrode, the second metal layer includes a data line, and the transparent conductive layer includes a pixel electrode; and wherein forming the second metal layer and the transparent conductive layer includes:

Sequentially forming a transparent conductive thin film and a metal thin film on the substrate;

Performing one patterning process on the transparent conductive thin film and the metal thin film to form a thin film transistor (TFT) channel region, the transparent conductive layer and the second metal layer.

In one example, the second metal layer includes a data line but does not include a source electrode and a drain electrode, the transparent conductive layer includes a pixel electrode, a source electrode and a drain electrode, and a portion below the second metal layer; or the second metal layer includes a data line and a source electrode but does not include a drain electrode, the transparent conductive layer includes a pixel electrode and a drain electrode, and a portion below the second metal layer; or the second metal layer includes a data line and a drain electrode but does not include a source electrode, the transparent conductive layer includes a pixel electrode and a source electrode, and a portion below the second metal layer; or the second metal layer includes a data line and a source electrode and a drain electrode, the transparent conductive layer includes a pixel electrode, and a portion below the second metal layer.

In one example, the one patterning process includes: a half-tone mask process and a photoresist reflowing process.

In one example, the photoresist reflowing process includes: using photoresist having reflowing characteristics and heat treating the photoresist to make the photoresist reflow.

In one example, performing the one patterning process to form a TFT channel region, the transparent conductive layer and the second metal layer includes:

Coating photoresist on the substrate formed with the transparent conductive thin film and the second metal thin film;

Exposing by using a half-tone mask, developing the exposed substrate to form a photoresist completely-reserved region, a photoresist half-reserved region and a photoresist completely-removed region, the photoresist completely-removed region at least corresponding to the region where the TFT channel is to be formed, and etching to form the TFT channel region;

Adopting the photoresist reflowing process to make the photoresist on both sides of the TFT channel region reflow so that the photoresist covers the TFT channel region, and controlling photoresist thickness in the TFT channel region by controlling the reflowing time and temperature, so that the photoresist thickness in the TFT channel region is larger than the photoresist thickness in the photoresist half-reserved region;

Performing ashing process on the photoresist to remove the photoresist in the photoresist half-reserved region and to form the transparent conductive layer;

Removing the exposed second metal thin film to form the second metal layer;

Removing the remaining portion of the photoresist.

In one example, the photoresist completely-reserved portion at least corresponds to the data line region, the photoresist half-reserved portion at least corresponds to the pixel electrode region, the source-drain electrode region, and the photoresist in other regions is completely removed; or the photoresist completely-reserved portion at least corresponds to the data line region and the source electrode region, the photoresist half-reserved portion at least corresponds to the pixel electrode region and the drain electrode region, and the photoresist in other regions is completely removed; or the photoresist completely-reserved portion at least corresponds to the data line region and the drain electrode region, the photoresist half-reserved portion at least corresponds to the pixel electrode region and the source electrode region, and the photoresist in other regions is completely removed; or the photoresist completely-reserved portion at least corresponds to the data line region and the source-drain electrode region, the photoresist half-reserved portion at least corresponds to the pixel electrode region, and the photoresist in other regions is completely removed.

In one example, before the transparent conductive thin film and the second metal thin film are formed, the first metal layer, the gate insulating layer and the active layer are sequentially formed on the substrate.

In one example, the photoresist completely-removed region further corresponds to the gate line terminal region, before the remaining portion of the photoresist is removed, the method further comprises: removing the exposed gate insulating thin film, so that at least the gate line in the gate line terminal region is exposed.

In one example, after the second metal layer is formed, the method further comprises: forming the gate insulating layer and the first metal layer on the substrate.

Another embodiment of the invention provides a fabrication method of a TN-type array substrate, comprising: a step of forming a first metal layer, a gate insulating layer, an active layer, a second metal layer and a transparent conductive layer on a substrate, Wherein the first metal layer includes a gate electrode, the second metal layer includes a data line and a data line terminal, the transparent conductive layer includes a pixel electrode; and the transparent conductive layer, the second metal layer, the active layer, the gate insulating layer and the first metal layer are sequentially formed on the substrate, Wherein, forming the first metal layer includes:

Forming a first metal thin film on the substrate;

Coating photoresist on the first metal thin film;

Exposing and developing the substrate by a half-gray or half-tone mask, to form a photoresist completely-reserved portion, a photoresist half-reserved portion and a photoresist completely-removed portion after developing, wherein the photoresist completely-reserved portion corresponds to the region including a region where a gate electrode is to be formed and regions on both sides of the data line terminal, the photoresist completely-removed portion corresponds to the data line terminal region, and the photoresist in other regions is half-reserved;

Removing the first metal thin film and the gate insulating layer disposed in the data line terminal region;

Heat treating the photoresist to make the photoresist reflow to the data line terminal region;

Performing ashing process on the photoresist completely-reserved portion and the photoresist half-reserved portion, removing the photoresist half-reserved portion, and still retaining the photoresist reflowing to the data line terminal region;

Removing the exposed first metal thin film, to form a pattern including the gate electrode; and Removing the remaining photoresist to expose the data line terminal.

Another embodiment of the invention provides a TN-type array substrate, comprising: a substrate, and a first metal layer, a gate insulating layer, an active layer, a second metal layer and a transparent conductive layer disposed on the substrate, wherein the second metal layer and the transparent conductive layer are formed by one patterning process, the transparent conductive layer includes a pixel electrode and a portion below the second metal layer.

In one example, the second metal layer includes a data line but does not include a source electrode and a drain electrode, and the transparent conductive layer includes a source electrode and a drain electrode; or the second metal layer includes a data line and a source electrode but does not include a drain electrode, and the transparent conductive layer includes a drain electrode; or the second metal layer includes a data line and a drain electrode but does not include a source electrode, and the transparent conductive layer further includes a source electrode; or the second metal layer includes a data line and a source electrode and a drain electrode.

In one example, the array substrate includes a data line terminal region, wherein there is no gate insulating layer on the data line at least in the data line terminal region.

In one example, the array substrate includes a gate line terminal region; and the first metal layer includes a gate electrode, a gate line and a common electrode line; and wherein there is no gate insulating layer on the gate line at least in the gate line terminal region.

In one example, the first metal layer, the gate insulating layer, the active layer, the transparent conductive layer and the second metal layer are sequentially stacked on the substrate.

Still another embodiment of the invention provides a display device, comprising: any one of the TN-type array substrates described above.

BRIEF DESCRIPTION OF THE DRAWINGS

In order to more clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
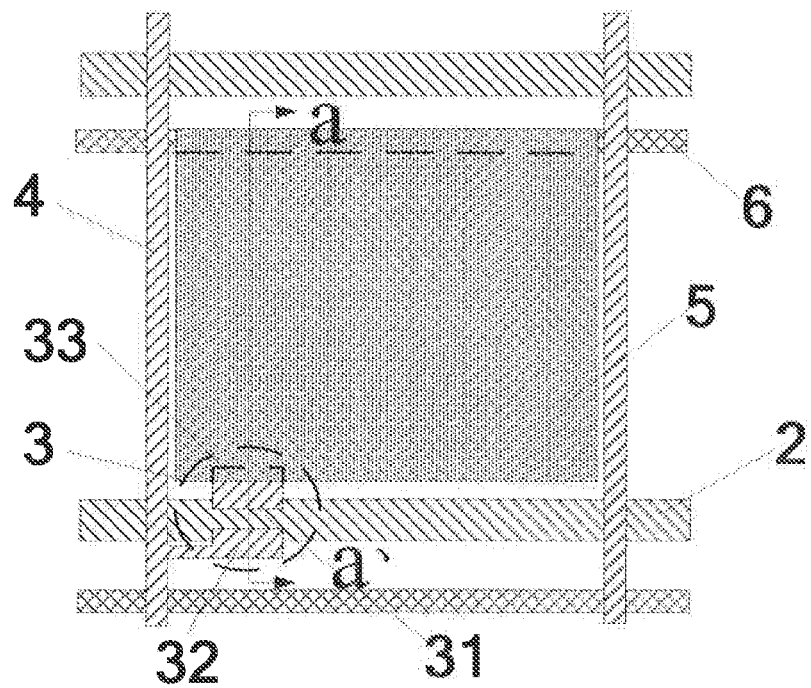
FIG. 1 is a structural schematic diagram of a partial top view of a conventional TN-type array substrate.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the present invention provides a fabrication method of a TN-type array substrate, comprising: a step of forming a first metal layer, a gate insulating layer, an active layer, a second metal layer and a transparent conductive layer on a substrate, wherein the first metal layer includes a gate electrode, the second metal layer includes a data line, and the transparent conductive layer includes a pixel electrode; and wherein the forming the second metal layer and the transparent conductive layer, for example, includes:

Sequentially forming a transparent conductive thin film and a metal thin film on the substrate;

Performing one patterning process to form a thin film transistor (TFT) channel region, the transparent conductive layer and the second metal layer.

In all embodiments of the present invention, it is necessary to clarify the definitions of "thin film", "layer", and "pattern" as well as the relationship thereof. The "thin film" refers to a layer of thin film fabricated on a substrate with a material via depositing or other processes. If the "thin film" does not need a patterning process during the entire fabrication procedure, then the "thin film" can also be called a "layer"; if the "thin film" needs a patterning process during the entire fabrication procedure, then it is called a "thin film" before the patterning process, and a "layer" after the patterning process. The "layer" undergoing the patterning process includes at least one thin film "pattern".

Exemplarily, the above-described gate insulating layer may be fabricated by depositing silicon nitride (SiNx) thin film on a transparent substrate. The gate insulating layer generally does not need a patterning process. Exemplarily again, a semiconductor layer is formed with a semiconductor thin film after patterning process. The first metal layer is formed with a metal thin film after patterning process, including a gate electrode, a gate line and a common electrode line. The gate electrode, the gate line and the common electrode line are just the thin film "pattern". The second metal layer is formed with a metal thin film after patterning process, including a data line. The transparent conductive layer is formed with a transparent conductive thin film after patterning process, including a pixel electrode.

The so-called "patterning process" is a process to form a thin film into a layer including at least one pattern; the patterning process referred to in the embodiments of the invention includes: coating photoresist on a thin film, exposing the photoresist by a mask, eroding away the photoresist which needs to be removed by developer, etching away a thin film portion uncovered with the photoresist, and finally removing the remaining photoresist.

An embodiment of the invention provides a fabrication method of a TN-type array substrate, forming a first metal layer by one patterning process; forming an active layer by one patterning process; forming a transparent conductive layer and a second metal layer by one patterning process, without a passivation layer, which, compared to the prior art, reduces the number of times of patterning processes, shortens fabrication cycle, and reduces costs.

Optionally, the second metal layer includes a data line but does not include a source and a drain electrode, correspondingly, the transparent conductive layer includes a pixel electrode, a source electrode, a drain electrode, and a portion below the second metal layer; thus, there is no drain electrode on the second metal layer, which may increase a pixel aperture ratio.

Or the second metal layer includes a data line and a source electrode but does not include a drain electrode, correspondingly, the transparent conductive layer includes a pixel electrode and a drain electrode and a portion below the second metal layer; thus, there is no drain electrode on the second metal layer, which may increase a pixel aperture ratio.

Or the second metal layer includes a data line and a drain electrode but does not include a source electrode, correspondingly, the transparent conductive layer includes a pixel electrode and a source electrode, and a portion below the second metal layer; since electrical conductivity of the second metal layer is better than that of the transparent conductive layer, the second metal layer includes a source electrode, which can turn on the pixel electrode more rapidly to implement display. In addition, there is no drain electrode on the second metal layer, which may increase a pixel aperture ratio.

Or the second metal layer includes a data line, a source and a drain electrode, and correspondingly, the transparent conductive layer includes a pixel electrode and a portion below the second metal layer.

It should be noted that the above four cases of the second metal layer and the transparent conductive layer are all within the protection scope of the invention, the embodiments with the accompanying drawings of the invention merely illustrate in detail with the case as an example that the second metal layer includes a data line and a source electrode, but does not include a drain electrode, the transparent conductive layer includes a pixel electrode and a drain electrode, as well as a portion below the second metal layer.

Figure 2:
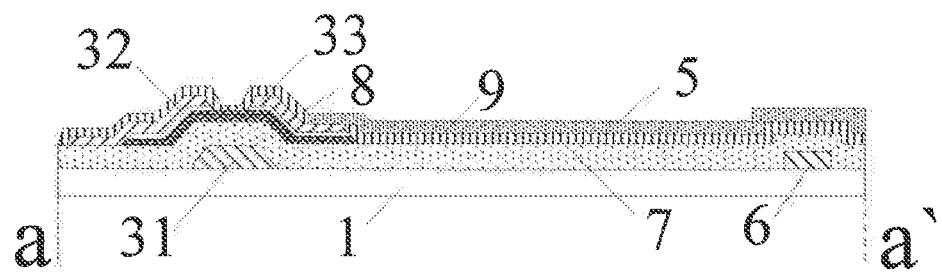
FIG. 2 is a schematic cross-sectional view of an array substrate illustrated in FIG. 1.
Figure 3:
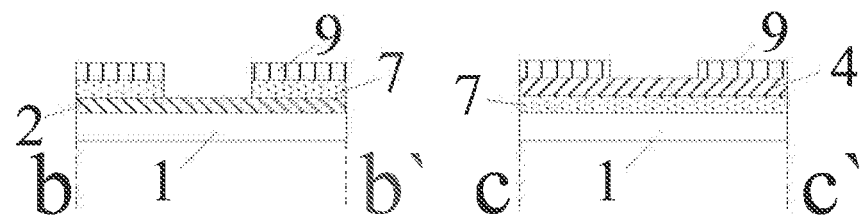
FIG. 3 is a schematic cross-sectional view of a gate line terminal region and a data line terminal region of an array substrate illustrated in FIG. 1.

It should be noted that, as illustrated in FIG. 1 and FIG. 2, the source electrode 32, the drain electrode 33 and the gate electrode 31 are three electrodes of a thin film transistor 3 on the array substrate, wherein the gate electrode 31 can be disposed above the source electrode 32 and drain electrode 33, which we call a top-gate array substrate; the gate electrode 31 can also be disposed below the source electrode 32 and drain electrode 33, which we call a bottom-gate array substrate. The fabrication method of a TN-type array substrate according to the embodiment of the invention is applicable to these two types, which will be respectively illustrated in detail below.

When the gate electrode is disposed below the drain electrode, forming the TN-type array substrate, for example, includes:

Step S101: forming a first metal thin film on a transparent substrate, and forming a first metal layer on the transparent substrate by one patterning process.

For example, the first metal layer is preferably made from molybdenum. Of course, the material forming the first metal layer is not limited thereto, and this embodiment of the invention is merely illustrated with such material as an example. For example, the material can be other conductive materials, such as chromium, aluminum and the like. And a metal thin film is formed on the transparent substrate by a deposition method, and the first metal layer is formed by one patterning process.

Step S102: forming a gate insulating layer on the transparent substrate.

For example, the gate insulating layer is preferably made from silicon nitride (SiNx). Of course, the material forming the gate insulating layer is not limited thereto, and this embodiment of the invention is merely illustrated with such material as an example. For example, the material can also be silica. And a SiNx thin film is formed on the substrate by a deposition method, to form a gate insulating layer.

Step S103: forming a semiconductor thin film on the transparent substrate, and forming an active layer on the transparent substrate by one patterning process.

For example, the semiconductor thin film is formed on the substrate by a deposition method, and the active layer is formed by one patterning process.

Step S104: sequentially forming a transparent conductive thin film and a metal thin film on the transparent substrate, and forming a TFT channel region, a transparent conductive layer and a second metal layer on the transparent substrate by one patterning process.

For example, the transparent conductive layer is preferably made from Indium tin oxide (ITO), and the second metal layer is preferably made from molybdenum. Of course, the materials forming the transparent conductive layer and the second metal layer are not limited thereto, and this embodiment of the invention is merely illustrated with such materials as an example. And preferably, the transparent conductive thin film and the second metal thin film are formed by using the deposition method.

Optionally, the one patterning process includes: a half-tone mask process and a photoresist reflowing process. And the photoresist reflowing process includes: using photoresist having reflowing characteristics, and heat treating the photoresist to make the photoresist reflow due to the reflowing characteristics thereof. For example, the photoresist reflowing process may be partially heating the photoresist to produce heating reflow. For example, heat treatment may be performed on the photoresist in the thin film transistor region to make the photoresist reflow to the channel region. Of course, heat treatment may be further performed on a layer of photoresist on the substrate. Reflowing indicates flowing of the melted photoresist during the heat treatment under the action of surface tension. Although all the heated regions on the substrate will have reflowing phenomenon, the photoresist on both sides of the channel/data line will completely cover the channel/data line after reflowing because the channel/data line is relatively narrow, especially in case of a width<5 μm, it is prone to be a full coverage. In the case of controlled temperature and time, thickness of the reflowing photoresist can be controlled, the heating temperature for reflowing is generally carried out at about 140° C., and the time varies with the thickness. However, this embodiment of the invention is not limited to these specific numerical conditions, but can be arbitrarily selected according to the actual situation.

For example, the above-described step S101 of forming a first metal thin film on a transparent substrate, and forming a first metal layer on the transparent substrate by one patterning process includes:

Step S1011: coating photoresist on the substrate formed with the first metal thin film.

The photoresist is classified into positive photoresist and negative photoresist. What forms insoluble substance after illumination is the negative photoresist; conversely, what forms soluble substance after illumination is the positive photoresist. The insoluble and the soluble are with regard to a specific developer. This embodiment of the invention is illustrated in detail with the photoresist being the positive photoresist as an example.

Step S1012: exposing and developing the substrate by a mask to form a photoresist completely-reserved portion and a photoresist removed portion after developing.

For example, the mask is a normal mask, which is divided into a transparent region and a non-transparent region. For the positive photoresist, soluble substance is formed in the region illuminated through the transparent region; and insoluble substance is formed in the region not illuminated. Then the photoresist is developed with developer, and the photoresist which need to be removed is removed. For example, the photoresist in the illuminated region is removed with developer, and the remaining photoresist in the region not illuminated is retained, i.e., the photoresist corresponding to a gate electrode, the gate line and the common electrode line.

Step S1013: removing the metal thin film not covered by the photoresist.

For example, the region of the metal thin film not covered by the photoresist may be etched away by etching solution.

Step S1014: removing the remaining photoresist.

The photoresist is removed, and the first metal layer including the gate line, the gate electrode and the common electrode line is formed on the base substrate.

For example, the above-described step S103 of forming an active layer on the transparent substrate by one patterning process includes steps of:

Step S1031: coating the photoresist on the semiconductor thin film.

For detailed description of the photoresist, the above step S1011 can be referred to, which will not be repeated herein.

Step S1032: exposing and developing the substrate by a mask to form a photoresist completely-reserved portion and a photoresist removed portion after developing.

For example, the description of the step S1012 can be referred to for the exposing and developing the substrate by a mask, which will not be repeated here.

Step S1033: removing the semiconductor thin film not covered by the photoresist.

For example, the region of the semiconductor thin film not covered by the photoresist can be etched away by the etching solution.

Step S1034: removing the remaining photoresist.

The photoresist is removed, and the active layer is formed on the substrate.

For example, the above-described step S104 of forming a TFT channel region, a transparent conductive layer and a second metal layer on the transparent substrate by one patterning process includes steps of:

Step S1041: coating the photoresist on the substrate formed with the transparent conductive thin film and the second metal thin film.

The above-described step S1012 may be referred to for the description of the photoresist, which will not be repeated here.

Step S1042: exposing the substrate by a half-tone mask, and developing and etching the exposed substrate to form the TFT channel region.

Figure 4:
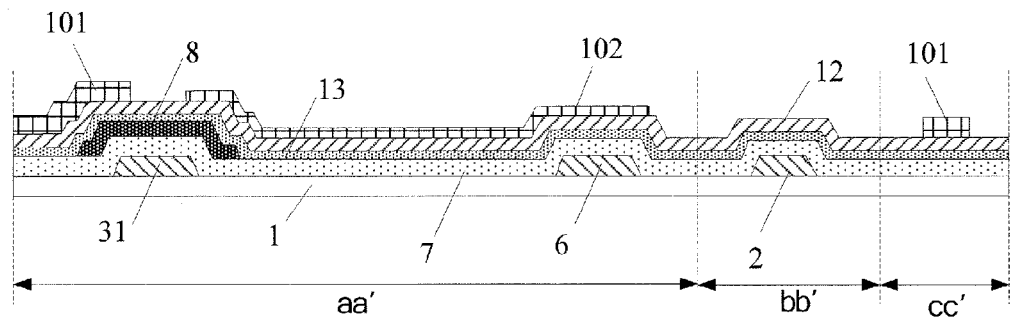
FIG. 4 is a schematic diagram of developed photoresist in a fabrication process of a TN-type array substrate illustrated in FIG. 11.
Figure 5:
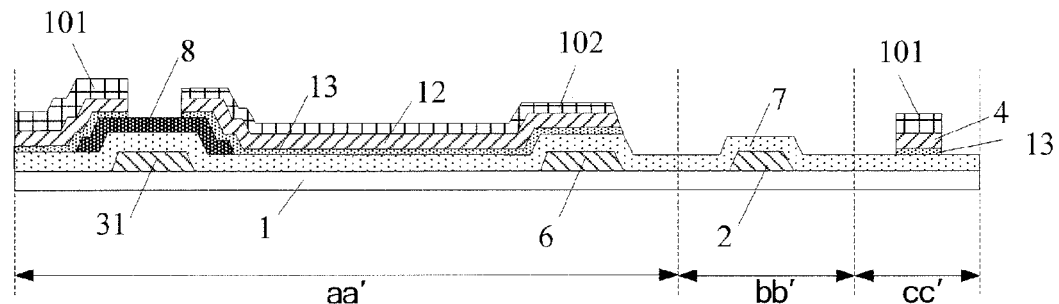
FIG. 5 is a schematic diagram after a metal thin film and a transparent conductive thin film in a photoresist completely-removed portion are removed in the fabrication process of the TN-type array substrate illustrated in FIG. 11.

As illustrated in FIG. 4-FIG. 5, for example, the following steps S10421-S10423 can be referred to.

Step S1043: adopting the photoresist reflowing technology to make the photoresist cover the TFT channel region.

Figure 7:
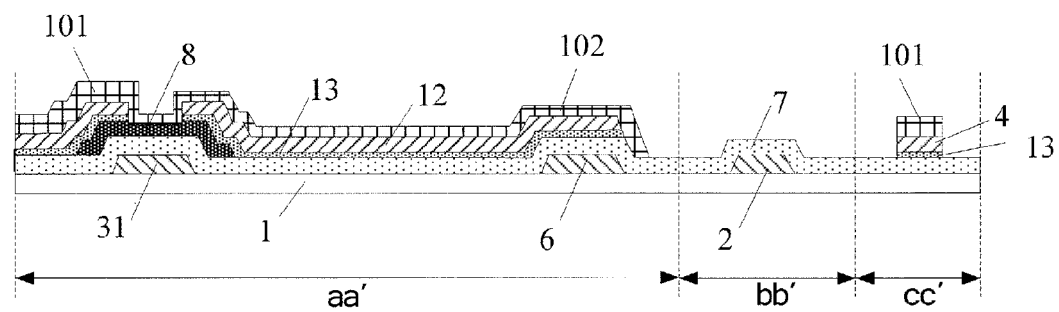
FIG. 7 is a schematic diagram after photoresist reflows in the fabrication process of the TN-type array substrate illustrated in FIG. 11.

As illustrated in FIG. 7, the photoresist reflows to the channel, i.e., covers the exposed semiconductor thin film in the channel, so as to protect it from being affected by the following step S1045. For example, since the semiconductor layer and the gate insulating layer are both non-metallic, etching the gate insulating thin film by plasma will also render the exposed semiconductor thin film to be etched, and therefore the photoresist is needed to further protect the exposed semiconductor thin film in the channel. Further, by controlling the reflowing temperature and time, the photoresist of the channel region is thicker than the photoresist in the photoresist half-reserved region after reflowing.

Step S1044: performing ashing process on the photoresist, and forming the transparent conductive layer.

Ashing process is performed on the photoresist completely-reserved portion and the photoresist half-reserved portion, the photoresist half-reserved portion is removed, and the photoresist in the photoresist completely-reserved portion becomes thinner.

Figure 8:
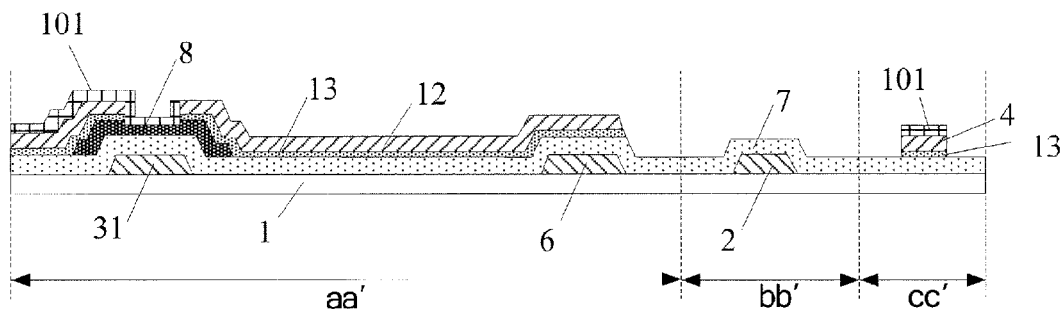
FIG. 8 is a schematic diagram after photoresist undergoes aching process, in the fabrication process of the TN-type array substrate illustrated in FIG. 11.

For example, the "ashing process", is to entirely thin the photoresist. Thus, the photoresist in the photoresist half-reserved portion is removed, and the photoresist in the photoresist completely-reserved portion becomes thinner, but is still retained, as illustrated in FIG. 8.

Figure 9:
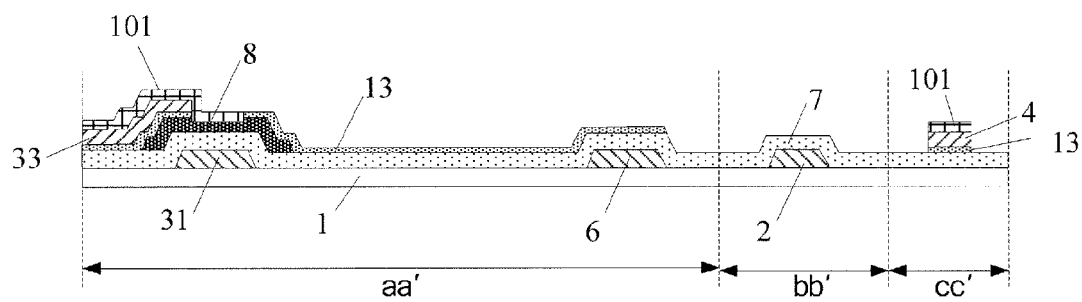
FIG. 9 is a schematic diagram after a metal thin film in a photoresist half-reserved portion is removed in the fabrication process of the TN-type array substrate illustrated in FIG. 11.

As illustrated in FIG. 9, after ashing process is performed on the photoresist, preferably, an etching method is adopted to remove the second metal thin film disposed in the photoresist half-reserved portion, to expose the formed transparent conductive layer.

Step S1045: removing the exposed gate insulating thin film, to expose at least the gate line disposed in the gate line terminal region.

Figure 10:
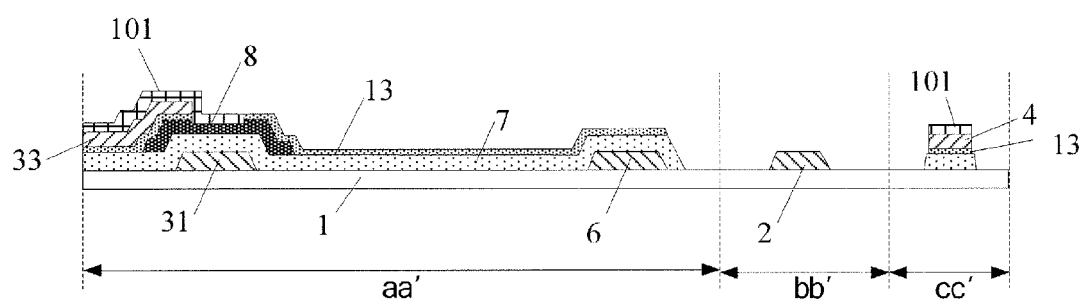
FIG. 10 is a schematic diagram after a gate insulating layer is removed in the fabrication process of the TN-type array substrate illustrated in FIG. 11.

As illustrated in FIG. 10, preferably, the gate insulating thin film is removed preferably by using a dry plasma etching method. Of course, the gate insulating thin film may not be removed, and further the gate line in the gate line terminal region may be connected to the drive circuit by arranging a via-hole in the gate insulating layer.

Step S1046: removing the photoresist of the remaining portion, and forming the second metal layer.

Figure 11:
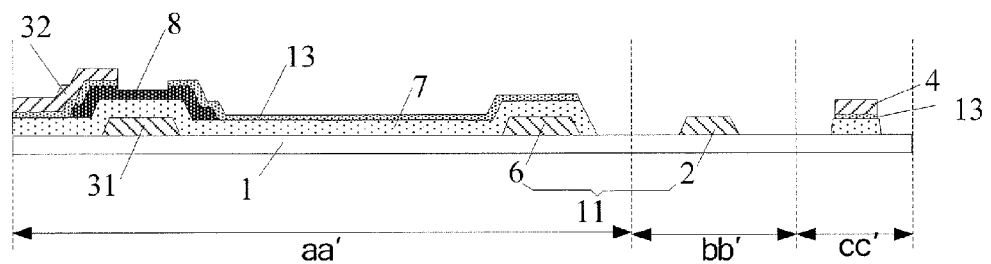
FIG. 11 is a schematic cross-sectional view of a TN-type array substrate according to an embodiment of the invention.

FIG. 11 is a schematic diagram of a TN-type array substrate after the photoresist is removed.

For example, the above-described step S1042 of exposing the substrate by a half-tone mask, and developing and etching the exposed substrate to form the TFT channel region, for example, includes:

S10421: exposing and developing the substrate by a half-tone mask to form a photoresist completely-reserved portion, a photoresist half-reserved portion and a photoresist completely-removed portion after developing, wherein the photoresist completely-reserved portion at least corresponds to the data line region, the photoresist half-reserved portion at least corresponds to the pixel electrode region and the source-drain electrode region, and the photoresist in other regions is completely removed; or the photoresist completely-reserved portion at least corresponds to the data line region and the source electrode region, the photoresist half-reserved portion at least corresponds to the pixel electrode region and the drain electrode region, and the photoresist in other regions is completely removed; or the photoresist completely-reserved portion at least corresponds to the data line region and the drain electrode region, the photoresist half-reserved portion at least corresponds to the pixel electrode region and the source electrode region, and the photoresist in other regions is completely removed; or the photoresist completely-reserved portion at least corresponds to the data line region and the source-drain electrode region, the photoresist half-reserved portion at least corresponds to the pixel electrode region, and the photoresist in other regions is completely removed. As illustrated in FIG. 4, the accompanying drawing of the embodiment of the invention is illustrated in detail with the case as an example that the photoresist completely-reserved portion 101 at least corresponds to the data line region and the source electrode region, the photoresist half-reserved portion 102 at least corresponds to the pixel electrode region and the drain electrode region, and the photoresist in other regions is completely removed, as illustrated in FIG. 4, the region where the photoresist is completely removed includes the channel region and the gate electrode terminal region bb'. It should be noted that in the embodiment of the invention, the photoresist half-reserved portion indicates the portion whose thickness is less than that of the photoresist completely-reserved portion, rather than limited to being half of the thickness of the photoresist completely-reserved portion.

S10422: removing the second metal thin film and the transparent conductive thin film of the photoresist completely-removed portion.

As illustrated in FIG. 5, for example, the second metal thin film and the transparent conductive thin film can be removed by the etching solution.

S10423: removing the exposed second sub-layer in the channel region.

Figure 6:
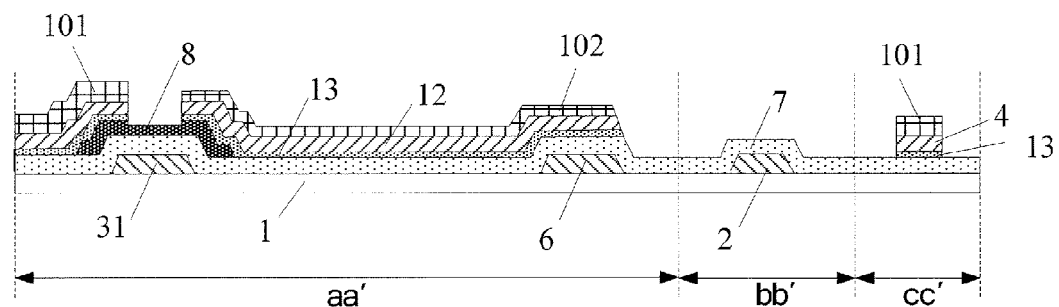
FIG. 6 is a schematic diagram after a second sub-layer in a semiconductor layer channel region is removed in the fabrication process of the TN-type array substrate illustrated in FIG. 11.

For example, the active layer includes: a first sub-layer and a second sub-layer sequentially formed. The first sub-layer is disposed below the second sub-layer and is a semiconductor layer, and the second sub-layer is a conductive layer. For example, in the post-fabrication process of the active layer, in order to reduce a contact resistance between the active layer and the metal thin film layer or the transparent conductive thin film layer, pentavalent elements such as phosphorus are doped, so that the second sub-layer is formed, since the second sub-layer is a conductive layer, it is necessary to remove the second sub-layer in the active layer channel region, leaving only the first sub-layer, as illustrated in FIG. 6.

When the gate electrode is disposed above the source-drain electrode, forming the TN-type array substrate, for example, includes:

Step S201: sequentially forming the transparent conductive thin film and the second metal thin film on the transparent substrate, and forming the transparent conductive layer and the second metal layer on the transparent substrate by one patterning process.

For example, the transparent conductive thin film and the metal thin film are preferably formed by using a deposition method on the transparent substrate. Forming the transparent conductive layer and the second metal layer on the transparent substrate by one patterning process, sequentially includes the above steps S1041, S1042, S1043, S1044, S1045 and S1046.

Step S202: forming a semiconductor thin film on the transparent substrate, and forming the active layer on the transparent substrate by one patterning process.

For example, the above-described step S103 may be referred to for forming the semiconductor thin film on the transparent substrate and forming the active layer on the transparent substrate by one patterning process.

Step S203: forming the gate insulating layer on the transparent substrate.

For example, the above-described step S102 may be referred to for forming the gate insulating layer on the transparent substrate.

Step S204: forming the first metal thin film on the transparent substrate, forming the first metal layer on the transparent substrate by one patterning process.

Forming the first metal layer on the transparent substrate by one patterning process, for example, includes:

Step S2031: coating the photoresist on the substrate formed with the first metal thin film.

Step S2032: exposing and developing the substrate by a half-gray or half-tone mask, to form a photoresist completely-reserved portion, a photoresist half-reserved portion and a photoresist completely-removed portion after developing. The photoresist completely-reserved portion corresponds to the gate line, the gate electrode, the common electrode line region and the regions on both sides of the data line terminal region, the photoresist completely-removed portion corresponds to the data line terminal region, and the photoresist in other regions is half-reserved.

Step S2033: removing the first metal thin film and the gate insulating layer disposed in the data line terminal region;

Step S2034: heat treating the photoresist to make the photoresist reflow into the data line terminal region;

Step S2035: performing aching process on the photoresist completely-reserved portion and the photoresist half-reserved portion, removing the photoresist half-reserved portion, and still retaining the photoresist reflowing to the data line terminal region;

Step S2036: removing the exposed first metal thin film.

Step S2037: removing the remaining photoresist.

Then the gate line on the first metal layer and at least the data line in the data line terminal region on the second metal layer do not have a covering layer thereon.

An embodiment of the invention provides a TN-type array substrate, as illustrated by FIG. 11, comprising: a substrate 1, and a first metal layer 11, a gate insulating layer 7, an active layer 8, a second metal layer 12 and a transparent conductive layer 13 disposed on the substrate 1. The second metal layer 12 and the transparent conductive layer 13 are formed by one patterning process, and the transparent conductive layer 13 includes a portion below the second metal layer and a pixel electrode.

For example, the second metal layer includes a data line but does not include a source and a drain electrode, and the transparent conductive layer further includes a source and a drain electrode; thus, there is no drain electrode on the second metal layer, which may increase a pixel aperture ratio.

Or, as illustrated in FIG. 11, the second metal layer 12 includes: a data line and a source electrode but does not include a drain electrode, and the transparent conductive layer further includes a drain electrode; since electrical conductivity of the second metal layer is better than that of the transparent conductive layer, the second metal layer includes a source electrode, which can turn on the pixel electrode more rapidly to implement display. In addition, there is no drain electrode on the second metal layer, which may increase a pixel aperture ratio. Only this type is taken as an example in the drawing of the embodiment of the invention.

Or the second metal layer includes: a data line and a drain electrode but does not include a source electrode, and the transparent conductive layer further includes a source electrode; since electrical conductivity of the second metal layer is better than that of the transparent conductive layer, the second metal layer includes a drain electrode, which can turn on the pixel electrode more rapidly to implement display.

Or the second metal layer includes: a data line, a source and a drain electrode, which thereby can turn on the pixel electrode more rapidly to implement display.

Optionally, there is no gate insulating layer on the data line at least in the data line terminal region. For example, as illustrated in FIG. 11, for the bottom-gate TN-type array substrate, since the data line 4 is disposed on the top layer, the data line 4 is completely exposed; for the top-gate TN-type array substrate, at least the data line in the data line terminal region is exposed. Thus, the data line is directly connected to the circuit board in the terminal region without a via-hole, which decreases a contact resistance between the data line and the circuit board, and reduces the power consumption.

Optionally, the first metal layer comprises: a gate electrode, a gate line and a common electrode line. There is no gate insulating layer on the gate line at least in the gate line terminal region, and the common electrode line and the transparent conductive layer form a storage capacitor. For example, for the top-gate TN-type array substrate, since the gate line is disposed on the top layer, the gate line is completely exposed; for the bottom-gate TN-type array substrate, as illustrated in FIG. 11, at least the gate line 2 in the gate line terminal region is exposed. Thus, the gate line is directly connected to the circuit board in the terminal region without a via-hole, which decreases a contact resistance between the gate line and the circuit board, and reduces the power consumption.

Furthermore, whether it is a bottom-gate TN-type array substrate or a top-gate TN-type array substrate, the common electrode line and the transparent conductive layer form a storage capacitor, and there is only a gate insulating layer between the common electrode line and the transparent conductive layer, which, compared to the prior art, improves the storage capacitor; and in the case of the same storage capacity in the prior art, the width of the common electrode line can be reduced, which further increases a pixel aperture ratio.

An embodiment of the invention provides a display device, comprising any one of the described TN-type array substrates according to the embodiments of the invention. The display device may be any product or component with a display function, such as a liquid crystal display, a liquid crystal display television, a digital camera, a mobile phone, a tablet computer and so on.

The foregoing embodiments merely are exemplary embodiments of the invention, and not intended to define the scope of the invention, and the scope of the invention is determined by the appended claims.

The invention claimed is:

1. A fabrication method of a Twist Nematic (TN)-type array substrate, comprising: a step of forming a first metal layer, a gate insulating layer, an active layer, a second metal layer and a transparent conductive layer on a substrate, wherein the first metal layer includes a gate electrode, the second metal layer includes a data line, and the transparent conductive layer includes a pixel electrode; and wherein forming the second metal layer and the transparent conductive layer includes:

sequentially forming a transparent conductive thin film and a metal thin film on the substrate;

performing a single-mask process on the transparent conductive thin film and the metal thin film to form a thin film transistor (TFT) channel region, the transparent conductive layer and the second metal layer;

wherein the second metal layer includes the data line but does not include a source electrode and a drain electrode; the transparent conductive layer includes the pixel electrode, the source electrode and the drain electrode, and a portion below the second metal layer; or a second metal layer includes the data line and the source electrode but does not include a drain electrode; the transparent conductive layer includes the pixel electrode and the drain electrode, and a portion below the second metal layer; or the second metal layer includes a data line and the drain electrode but does not include a source electrode; the transparent conductive layer includes the pixel electrode and the source electrode, and a portion below the second metal layer.

2. The method according to claim 1, wherein the single-mask process includes: a half-tone mask process and a photoresist reflowing process.

3. The method according to claim 2, wherein the photoresist reflowing process includes: using photoresist having reflowing characteristics and heat treating the photoresist to make the photoresist reflow.

4. The method according to claim 2, wherein performing the single-mask process to form the TFT channel region, the transparent conductive layer and the second metal layer includes:
coating photoresist on the substrate formed with the transparent conductive thin film and the metal thin film;
exposing the photoresist by using the half-tone mask process, developing an exposed metal thin film to form a photoresist completely-reserved region, a photoresist half-reserved region and a photoresist completely-removed region, the photoresist completely-removed region at least corresponding to a region where the TFT channel region is to be formed, and etching to form the TFT channel region;
adopting the photoresist reflowing process to make the photoresist on both sides of the TFT channel region reflow so that the photoresist covers the TFT channel region, and controlling photoresist thickness in the TFT channel region by controlling the reflowing time and temperature, so that the photoresist thickness in the TFT channel region is larger than the photoresist thickness in the photoresist half-reserved region;
performing an ashing process on the photoresist to remove the photoresist in the photoresist half-reserved region and to form the transparent conductive layer;
removing the exposed metal thin film to form the second metal layer;
removing a remaining portion of the photoresist.

5. The method according to claim 4, wherein, before the transparent conductive thin film and the metal thin film are formed, the first metal layer, the gate insulating layer and the active layer are sequentially formed on the substrate.

6. The method according to claim 4, wherein, the photoresist completely-removed region further corresponds to a gate line terminal region, before the remaining portion of the photoresist is removed, the method further comprises: removing an exposed gate insulating thin film, so that at least a gate line in the gate line terminal region is exposed.

7. A fabrication method of a Twist Nematic (TN)-type array substrate, comprising: a step of forming a first metal layer, a gate insulating layer, an active layer, a second metal layer and a transparent conductive layer on a substrate,
wherein, the first metal layer includes a gate electrode; the second metal layer includes a data line and a data line terminal, the transparent conductive layer includes a pixel electrode; and the transparent conductive layer, the second metal layer, the active layer, the gate insulating layer and the first metal layer are sequentially formed on the substrate,
wherein, forming the first metal layer includes:
forming a first metal thin film on the substrate;
coating photoresist on the first metal thin film;
exposing and developing the substrate by a half-gray or half-tone mask to form a photoresist completely-reserved portion, a photoresist half-reserved portion and a photoresist completely-removed portion after developing, wherein the photoresist completely-reserved portion corresponds to a region including a region where the gate electrode is to be formed and regions on both sides of the data line terminal, the photoresist completely-removed portion corresponds to the data line terminal region, and the photoresist in other regions is half-reserved;
removing the first metal thin film and the gate insulating layer disposed in a data line terminal region;
performing photoresist reflow process, wherein the photoresist is heated so as to reflow to the data line terminal region;
performing an ashing process on the photoresist completely-reserved portion and the photoresist half-reserved portion, removing the photoresist half-reserved portion, and still retaining the photoresist reflowing to the data line terminal region;
removing the exposed first metal thin film, to form a pattern including the gate electrode; and
removing the remaining photoresist to expose the data line terminal; and
wherein the second metal layer includes the data line but does not include a source electrode and a drain electrode; the transparent conductive layer includes the pixel electrode, the source electrode and the drain electrode, and a portion below the second metal layer; or the second metal layer includes the data line and a source electrode but does not include a drain electrode; the transparent conductive layer includes the pixel electrode and the drain electrode, and a portion below the second metal layer; or the second metal layer includes the data line and a drain electrode but does not include a source electrode; the transparent conductive layer includes the pixel electrode and the source electrode, and a portion below the second metal layer.

8. A Twist Nematic (TN)-type array substrate, comprising: a substrate, and a first metal layer, a gate insulating layer, an active layer, a second metal layer and a transparent conductive layer disposed on the substrate, wherein the first metal layer comprises a gate line, the second metal layer and the transparent conductive layer are formed by one single-mask process, the transparent conductive layer includes a pixel electrode and a portion below the second metal layer; and
wherein the second metal layer includes a data line but does not include a source electrode and a drain electrode; the transparent conductive layer includes the pixel electrode, the source electrode and the drain electrode, and a portion below the second metal layer; or the second metal layer includes a data line and a source electrode but does not include a drain electrode; the transparent conductive layer includes the pixel electrode and the drain electrode, and a portion below the second metal layer; or the second metal layer includes a data line and a drain electrode but does not include a source electrode; the transparent conductive layer includes the pixel electrode and the source electrode, and a portion below the second metal layer.

9. The TN-type array substrate according to claim 8, wherein, the array substrate includes a data line terminal region, wherein there is no gate insulating layer on the data line at least in the data line terminal region.

10. The TN-type array substrate according to claim 8, wherein the array substrate includes a gate line terminal region; and the first metal layer includes a gate electrode, a gate line and a common electrode line; and wherein there is no gate insulating layer on the gate line at least in the gate line terminal region.

11. The TN-type array substrate according to claim 8, wherein the first metal layer, the gate insulating layer, the active layer, the transparent conductive layer and the second metal layer are sequentially stacked on the substrate.

12. A display device, comprising the TN-type array substrate according to claim 8.

13. The method according to claim 3, wherein performing the single mask process to form the TFT channel region, the transparent conductive layer and the second metal layer includes:

coating photoresist on the substrate formed with the transparent conductive layer and the second metal layer;

exposing the photoresist by using the half-tone mask process, developing an exposed metal thin film to form a photoresist completely-reserved region, a photoresist half-reserved region and a photoresist completely-removed region, the photoresist completely-removed region at least corresponding to a region where the TFT channel region is to be formed, and etching to form the TFT channel region;

adopting the photoresist reflowing process to make the photoresist on both sides of the TFT channel region reflow so that the photoresist covers the TFT channel region, and controlling photoresist thickness in the TFT channel region by controlling the reflowing time and temperature, so that the photoresist thickness in the TFT channel region is larger than a photoresist thickness in the photoresist half-reserved region;

performing an ashing process on the photoresist to remove the photoresist in the photoresist half-reserved region and to form the transparent conductive layer;

removing the exposed metal thin film to form the second metal layer;

removing a remaining portion of the photoresist.

\* \* \* \* \*